United States Patent [19]

Ono et al.

[11] Patent Number: 5,179,532
[45] Date of Patent: Jan. 12, 1993

[54] TRANSFERING BLOCH LINES USING PERPENDICULAR AND IN-PLANE PULSE MAGNETIC FIELDS

[75] Inventors: Takeo Ono, Atsugi; Fumihiko Saito, Sagamihara; Hitoshi Oda, Yokohama; Kou Yoneda, Machida; Akira Shinmi, Yokohama; Tetsuya Kaneko; Nobuo Watanabe, both of Atsugi, all of Japan

[73] Assignee: Canon Kabushiki Kaisha, Tokyo, Japan

[21] Appl. No.: 811,912

[22] Filed: Dec. 23, 1991

Related U.S. Application Data

[63] Continuation of Ser. No. 596,429, Oct. 11, 1990, abandoned, which is a continuation of Ser. No. 98,786, Sep. 21, 1987, abandoned.

[30] Foreign Application Priority Data

Sep. 24, 1986 [JP] Japan .................. 61-226825

[51] Int. Cl.$^5$ .................. G11C 11/14; G11C 19/08
[52] U.S. Cl. .................. 365/87; 365/29
[58] Field of Search .................. 365/87, 29

[56] References Cited

U.S. PATENT DOCUMENTS

| 4,583,200 | 4/1986 | Konishi et al. | 365/29 |
| 4,731,752 | 3/1988 | Hidaka | 365/87 |

FOREIGN PATENT DOCUMENTS

| 0106358 | 4/1984 | European Pat. Off. | 365/87 |
| 3542279A1 | 6/1986 | Fed. Rep. of Germany | 365/29 |
| 113389 | 6/1985 | Japan | 365/87 |

OTHER PUBLICATIONS

"Vertical Bloch Pair Operation by In-Plane Field for Bloch Line Memory", IEEE Transactions on Magnetics, vol. Mag-22, No. 5, pp. 793-795.

"Chip Organization of Bloch Line Memory", IEEE Transactions on Magnetics, vol. Mag-22, No. 5, Sep. 1986, pp. 784-789.

"Vertical Bloch Line Memory"; Humphrey et al.; IEEE Transactions on Magnetics, vol. Mag-21, No. 5, Sep. 1985; pp. 1762-1766.

Primary Examiner—Joseph A. Popek
Attorney, Agent, or Firm—Fitzpatrick, Cella, Harper & Scinto

[57] ABSTRACT

A Bloch line transferring method or system comprises a step of transferring only a first Bloch line of the Bloch line pair in the magnetic wall in a predetermined direction, and a step of transferring a second Bloch line of the Bloch line pair in the predetermined direction to form the Bloch line pair. It typically comprises applying a magnetic field perpendicular to a film plane of a magnetic thin film having the magnetic wall, to the magnetic thin film, and applying a magnetic field parallel to the film plane of the magnetic film, to the magnetic thin film along the magnetic wall.

31 Claims, 7 Drawing Sheets

FIG. IA (PRIOR ART)
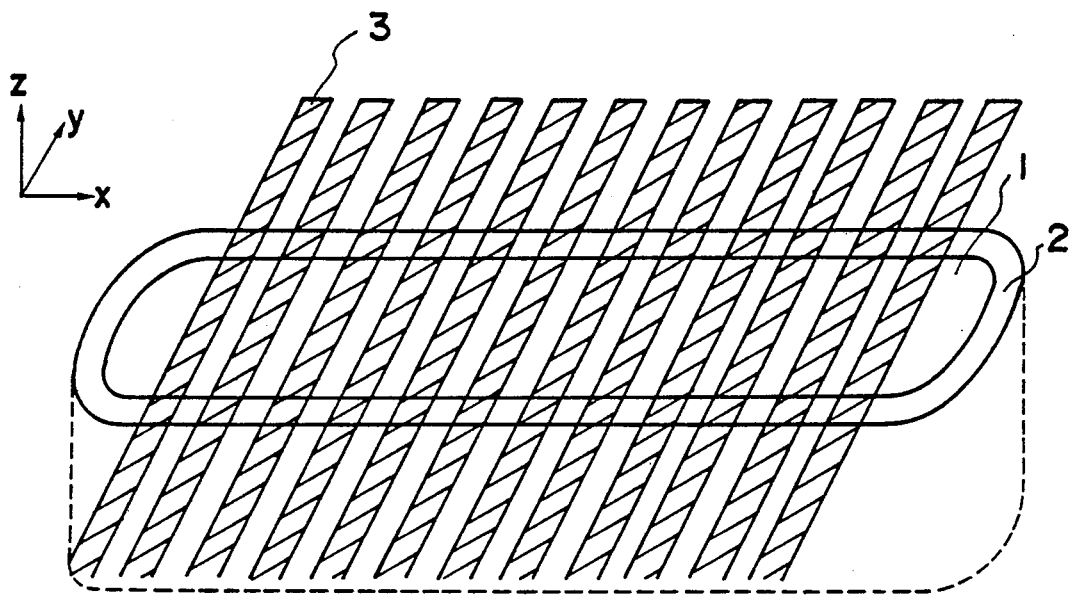
FIG. IB (PRIOR ART)
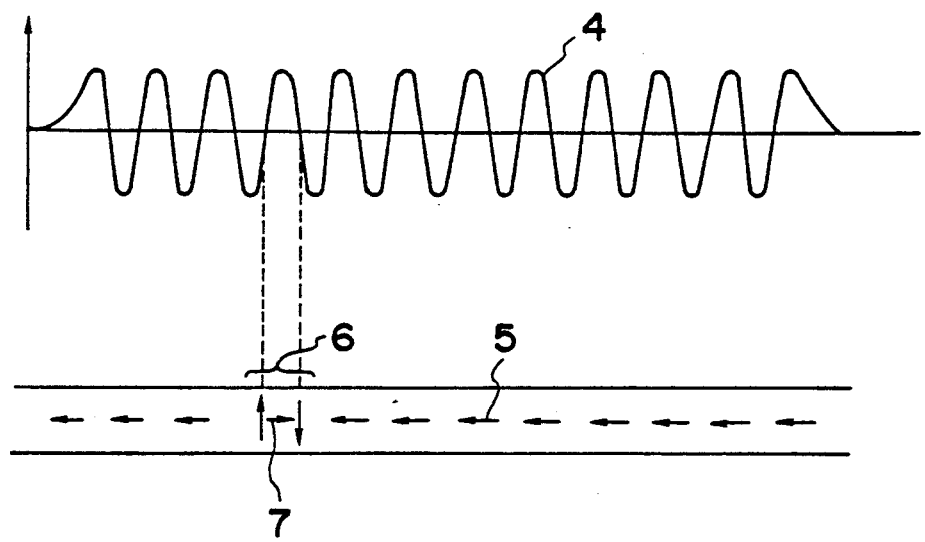

TRANSFERING BLOCH LINES USING PERPENDICULAR AND IN-PLANE PULSE MAGNETIC FIELDS

This application is a continuation of application Ser. No. 07/596,429 filed Oct. 11, 1990, now abandoned which is a continuation of application Ser. No. 07/098,786 filed Sep. 21, 1987, now abandoned.

BACKGROUND OF THE INVENTION

1. Field of the Invention

The present invention relates to a method for stably transferring a Bloch line which is present in a magnetic wall of a stripe magnetic domain.

The present invention also relates to a magnetic memory apparatus which can record and reproduce information stably and at a high speed by transferring a Bloch line which is an information carrier, by a novel method.

2. Related Background Art

Computer external memory, electronic file memory and still image file memory use memory devices such as magnetic tape, Winchester disks, floppy disks, opto-magnetic disks or magnetic bubble memories. These memory devices other than the magnetic bubble memory, require relative motion between a record medium such as a tape or disk and a reproducing head. As a result, for high density recording, problems of tracking, drive and, wear of the medium and the head, dust, vibration, and, in the optical disk and the opto magnetic disk, a problem of focusing, occur.

As disclosed in U.S. patent application Ser. No. 434,538, filed Nov. 8, 1989, assigned to the assignee of the present invention, the magnetic bubble memory does not need a mechanical drive and is highly reliable. Accordingly, it has been considered that the magnetic bubble memory was advantageous in high density recording. However, since the magnetic bubble memory uses, as a bit, a circular magnetic domain (bubble) developed in a magnetic garnet film having an easy axis of easy magnetization which is normal to the film plane, an upper limit of recording density is several tens of M bits/chip even if a minimum bubble (0.3 $\mu$m in diameter) restricted by the material properties of a currently available garnet film, is used. As compared with a semiconductor memory which will be a competing memory in future, there is not much difference in capacity. Accordingly, an application range as a memory is very narrow.

A Bloch line memory disclosed in U.S. Pat. No. 4,583,200 has recently been accorded attention as a way to overcome the limitation of recording density in the magnetic bubble memory. Technology relating to the Bloch line memory are disclosed in U.S. patent application Ser. No. 660,260 filed Feb. 26, 1991 and allowed Jul. 9, 1991, and U.S. Pat. Nos. 4,974,201 and 4,974,200.

In the Bloch line memory, two transition regions in which directions of magnetization twist in a magnetic wall which is present around a stripe magnetic domain developed in a magnetic garnet film are opposite to each other, that is, two regions (Bloch line) defined by a Nail magnetic wall between the Bloch magnetic wall structures are used as a unit of memory, and the pair of Bloch lines are used as one bit. In the Bloch line memory, since the width of a Bloch line is usually one tenth of the width of a magnetic domain, a recording density which is almost ten times as high as that of the magnetic bubble memory can be attained. For example, when a garnet film having a bubble diameter of 0.5 $\mu$m is used, a memory capacity of 1.6 G bits/chip is attainable.

In the Bloch line memory, it is necessary to establish a stable position of the Bloch line pair, which is a unit of memory, in the magnetic wall, to store information stably into the memory, and stably transfer it bit by bit at a high speed.

FIGS. 1A and 1B and FIGS. 2A and 2B show stabilization and transfer method for the Bloch line pairs shown in U.S. Pat. No. 4,583,200. FIG. 1A shows a stabilization pattern formed on a magnetic film to stabilize the Bloch line pair. FIG. 1B illustrates a potential in the magnetic film and stabilization of the Bloch line memory, due to the formation of the stabilization pattern. FIG. 2A shows a method for transferring the Bloch line pair and FIG. 2B shows a pulse waveform of a perpendicular pulse magnetic field used to transfer the Bloch line pair.

In the past, in order to stabilize the Bloch line pair, a stripe pattern 3 extending orthogonally to a longitudinal direction of the stripe magnetic domain 1 was formed on the magnetic film as shown in FIG. 1A, and cross-points of the magnetic wall 2 of the stripe magnetic domain 1 and the stripe pattern 3 were used as the stable points of the Bloch line pair.

The stripe pattern 3 may be formed by a ferromagnetic material layer having an axis of any magnetization normal to a film plane or in the stripe magnetic domain 1 or an axis of easy magnetization along a width of the stripe in the film plane, or by implanting ions into the magnetic film to a uniform depth.

By providing a distribution 4 of a magnetic field $H_X$ along the longitudinal direction of the stripe magnetic domain 1 as shown in FIG. 1B, along the magnetic wall 2 of the stripe magnetic domain 1, by the ferromagnetic material film pattern or the ion implanted region pattern, a periodic potential well to the Bloch line pair 6 formed by the Sehmann energy between the magnetic field $H_X$ and the magnetization 7 acts as a magnetic wall between the Bloch line pair.

In the above memory, the magnetization of the Bloch line is rotated by a gyro-force by application of a pulse magnetic field $HP_{P\perp}$ in a direction of arrow 8 normal to the film plane of the magnetic garnet film as shown in FIG. 2A. In FIG. 2A, the Bloch line is moved in a direction of arrow 9 as the magnetization is rotated so that the Bloch line pair 6 is transferred by one bit.

In this system, the shape of the potential well to the Bloch line pair is laterally symmetric. Thus, if the Bloch line transfer pulse magnetic field is of simple square waveform, the Bloch line pair is moved in the direction of the arrow 9 at the rise of the pulse but is returned to the original position at the fall of the pulse, and stable transfer in one direction is not attained. In the prior art, unidirectional transfer is attained by applying a pulse magnetic field which has a sufficiently longer fall time $t_2$ than a rise time $t_1$ as shown by graph 10 of FIG. 2B. However, in this system, since two Bloch lines are simultaneously moved, the Bloch lines vibrate due to attraction force or repelling force between the Bloch lines and stable transfer is not attained. Further, since a spacing between the Bloch lines of the pair is very short, the depth of the potential well due to the Sehmann energy is shallow and stabilization of the Bloch line pair 6 is hard to attain. When the magnetic garnet film is made of conventional bubble material, it is necessary that the fall time $t_2$ is longer than 1 $\mu$ sec. This causes a very low Bloch line transfer speed. In order to generate the pulse waveform as shown in FIG. 2B, the required electric circuit is more complex and a power consumption is larger than those for a square wave pulse.

When the Bloch lines are transferred by the prior art transfer method to record or reproduce information to or from the Bloch line memory, it is difficult to accurately record or reproduce information because of instability of Bloch line transfer, that is, instability of information transfer.

SUMMARY OF THE INVENTION

It is an object of the present invention to provide a method for transferring a Bloch line in a magnetic wall in a stable manner.

It is another object of the present invention to provide a method for transferring Bloch lines with a simple circuit and low power consumption.

It is another object of the present invention to provide a magnetic memory apparatus which uses Bloch lines as an information carrier and accurately records and reproduces information by transferring the Bloch lines in a novel method.

In order to achieve the above objects, the method for transferring the Bloch line of the present invention transfers the Bloch line pair in the magnetic wall in a predetermined direction. It comprises a step of transferring only a first Bloch line of the Bloch line pair in the predetermined direction, and a step of transferring a second Bloch line of the Bloch line pair in the predetermined direction to form the Bloch line pair.

A typical manner of carrying out the transfer method of the present invention is to transfer the Bloch lines in the magnetic wall in the predetermined direction. It comprises a first step of applying a magnetic field perpendicular to a film plane of a magnetic thin film having the magnetic wall, to the magnetic thin film, and a second step for applying a magnetic field parallel to the film plane of the magnetic thin film, to the magnetic thin film along the magnetic wall.

In order to achieve the above objects, the magnetic memory apparatus of the present invention records and reproduces information by using the Bloch lines in the magnetic wall as an information carrier. It comprises a Bloch line memory device carrying on a substrate a magnetic thin film having a stripe magnetic domain, write means for writing a Bloch line in accordance with input information at a predetermined position in a magnetic wall of the stripe magnetic domain, read means for detecting a Bloch line present at the predetermined position of the stripe magnetic domain to produce a signal indicative of the information, transfer means for transferring Bloch lines of a Bloch line pair, one by one, along the magnetic wall of the stripe magnetic domain, and control means for supplying control signals to those means to synchronously control the read means or the write means and the transfer means.

Other features and advantages of the present invention will be fully apparent for the detailed description of the preferred embodiments which follows, in conjunction with the accompanying drawings. Various transfer methods and magnetic memory apparatus will be provided in accordance with the concept of the present invention.

BRIEF DESCRIPTION OF THE DRAWINGS

FIGS. 1A and 1B illustrate a prior art stabilization method for a Bloch line pair.

DETAILED DESCRIPTION OF THE PREFERRED EMBODIMENTS

FIGS. 3A and 3B and FIGS. 4A-4D illustrate the transfer method for Bloch lines in accordance with the present invention.

In FIGS. 3A, 3B and 4A-4D, figures relating to a magnetic wall 2 other than waveforms are a partial plan view of the stripe magnetic domain shown in FIG. 1, as viewed in a Z direction.

Accordingly, the magnetic wall 2 is a magnetic wall in a predetermined stripe magnetic domain, and the stripe magnetic domain is formed in a magnetic thin film such as magnetic garnet. The magnetic thin film is formed on a predetermined substrate by a liquid phase growth method. The stripe magnetic domain may be formed in the magnetic thin film in a desired state by applying a biasing magnetic field perpendicularly to the film plane of the magnetic thin film.

A specific structure of the magnetic material including the stripe magnetic domain is described in U.S. Pat. No. 4,583,200.

Figure 2A:
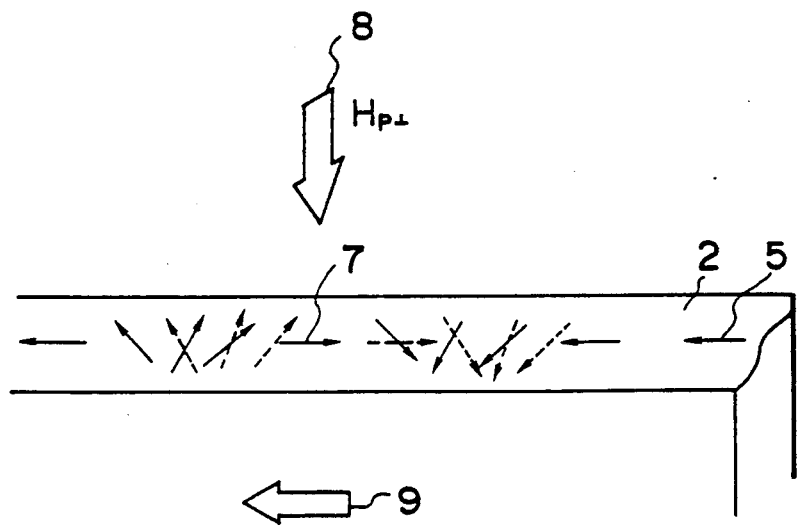
FIGS. 2A and 2B illustrate a prior art transfer method for the Bloch line pair.
Figure 2B:
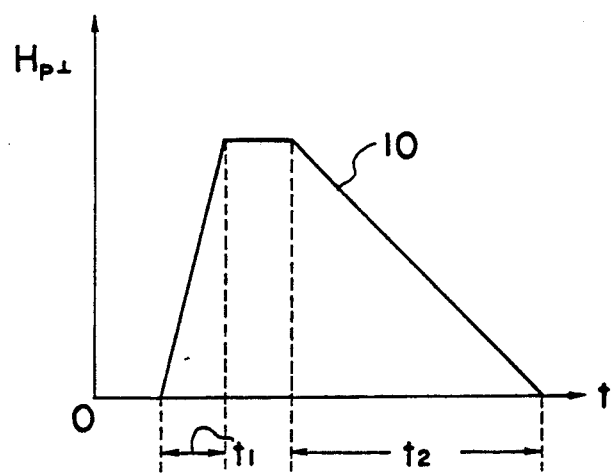
Figure 3A:
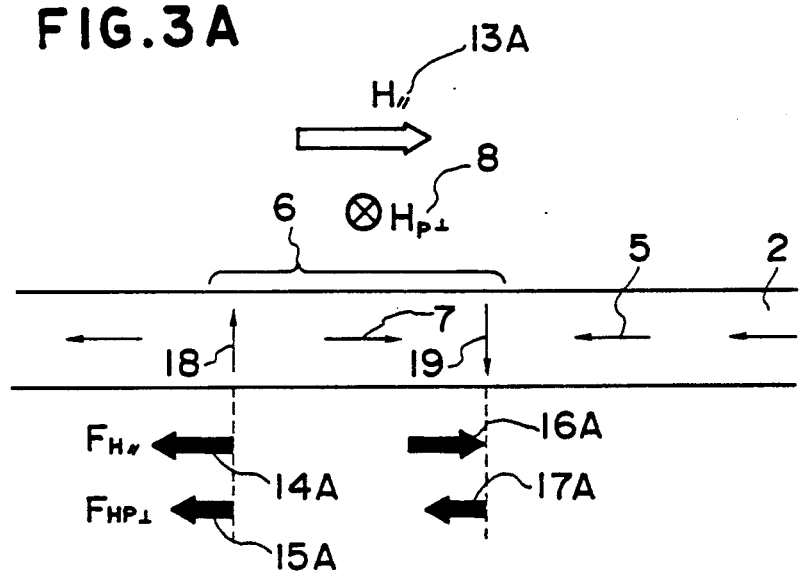
FIGS. 3A and 3B and FIGS. 4A-4D illustrate a transfer method for Bloch lines in accordance with the present invention.
Figure 3B:
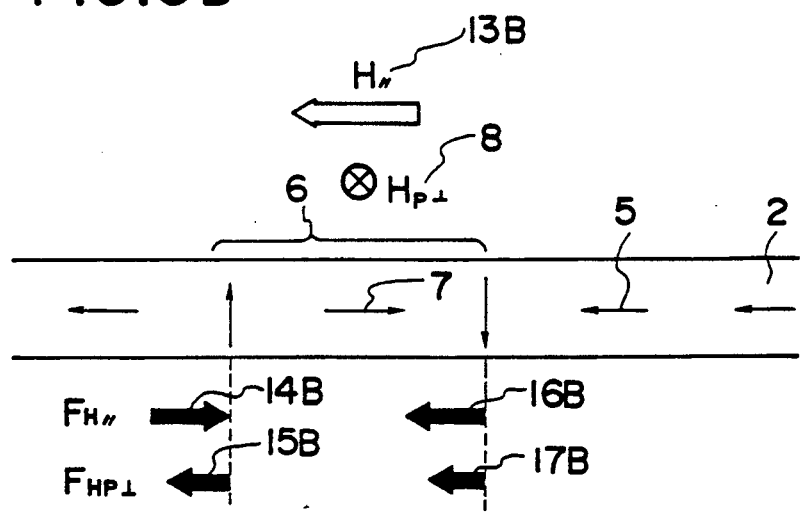
Figure 4A:
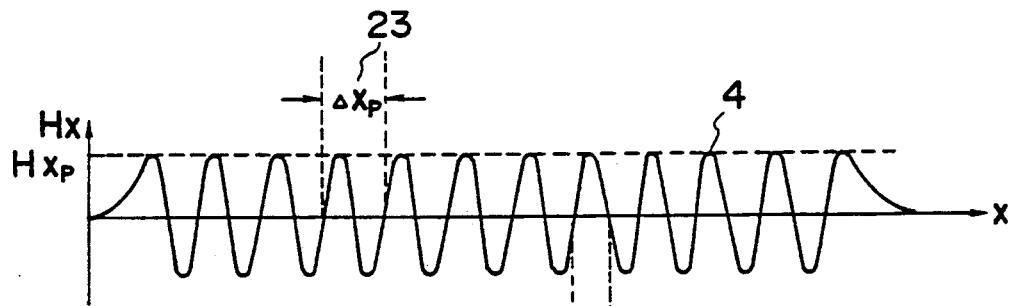
Figure 4B:
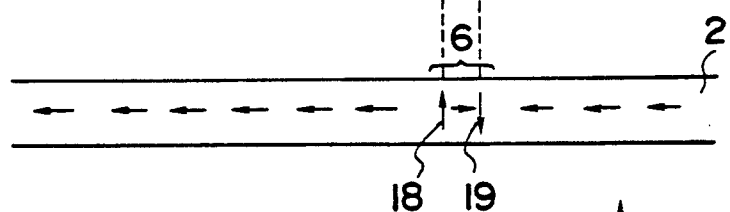
Figure 4C:
Figure 4D:
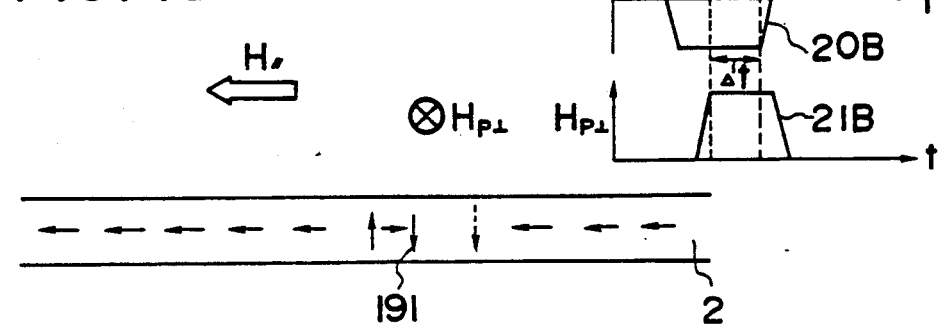

In FIGS. 3A, 3B and 4A-4D, numeral 2 denotes a magnetic wall including a Bloch line pair, numeral 5 denotes magnetization in the magnetic wall in areas other than the Bloch line pair area, numeral 6 denotes the Bloch line pair, numeral 7 denotes magnetization in the magnetic wall between the Bloch lines of the Bloch line pair, and numeral 8 denotes a pulse magnetic field applied orthogonally to the magnetic film for giving a gyro-force to the Bloch lines 18 and 19 to transfer them, numerals 13A and 13B denote in-plane magnetic field $H''$ along the longitudinal direction of the stripe magnetic domain to apply a drive force to the Bloch lines 18 and 19 to transfer them in one direction, and numerals 14A and 14B denote a drive force $F_{H''}$ applied to the left Bloch line 18 by the in-plane magnetic field $H''$. Numerals 15A and 15B denote a gyro-force $F_{HP\perp}$ applied to the left Bloch line 18 by the perpendicular pulse magnetic field $H_{P\perp}$, numerals 16A and 16B denotes a force applied to the right Bloch line by the in-plane magnetic field $H''$, and numerals 17A and 17B denote a force applied to the right Bloch line 19 by the perpendicular magnetic field $H_{P\perp}$. In FIG. 4A, numeral 4 denotes distribution of the in-plane magnetic field $H_X$ along the magnetic wall which will be a potential wall to the Bloch line pair 6. In FIG. 4B, numerals 18 and 19 again denote two Bloch lines of the Bloch line pair 6. In FIGS. 4C and 4D, numerals 20A and 20B denote waveforms of the in-plane magnetic field H", numerals 21A and 21B denote waveforms of the perpendicular pulse magnetic field $H_{P\perp}$, Δt denotes a time during which both H" and $H_{P\perp}$ are simultaneously applied, and numeral 23 denotes a pitch $\Delta X_P$ of the periodical distribution of the in-plane magnetic field $H_X$. The operation of the Bloch line transfer of the present invention is now explained in sequence. In FIG. 3A, forces $F_{HP\perp}$ shown by arrows 15A and 17A are applied to the Bloch lines 18 and 19 in the same direction by a perpendicular pulse magnetic field $H_{P\perp}$ so that the Bloch lines 18 and 19 tend to be moved leftward. If an in-plane magnetic field H" along the magnetic wall (longitudinal direction of the stripe magnetic domain) is applied at this time, forces $F_{H''}$ which tend to broaden a spacing between the Bloch lines are applied as shown by arrows 14A and 16A. As a result, a force having a magnitude of $|F_{HP\perp}|+|F_{H''}|$ is applied leftward to the left Bloch line 18, and a force having a magnitude of $|F_{HP\perp}|-|F_{H''}|$ is applied to the right Bloch line 19. A velocity $V_{BL}$ of the Bloch line moved by $F_{HP\perp}$ is given by $$V_{BL} = \frac{a\gamma}{\pi} H_{P\perp} \quad (1)$$

where the movement of the magnetic wall is not taken into consideration, a is a length of the magnetic wall under consideration, (in the present case, only a width $\pi\Lambda$ of the Bloch line may be considered), γ is a gyroforce magnetic constant, and Λ is a Bloch line width parameter. In the formula (1), since $a = \pi\Lambda$, it is expressed as $$V_{BL} = \Lambda\gamma H_{P\perp} \quad (2)$$

A velocity $V'_{BL}$ of the Bloch line moved by the force $F_{H''}$ developed by the in-plane magnetic field H" is represented by $$V_{BL} = \frac{\pi\Delta_0\gamma Q^{1/2}}{2\alpha} H_{\parallel} \quad (3)$$

where α is a Gilbert damping constant, Q is a parameter for indicating magnetic anisotropy and expressed by $Q = Kv/2\pi M_s^2$, Kv is a uniaxial anisotropy constant, Ms is a saturation magnetization, $\Delta_0$ is a magnetic wall width parameter and expressed by $\pi\Delta_0$.

Accordingly, in FIG. 3A, the velocity $V_{BL18}$ of the left Bloch line 18 is given, from the formulas (2) and (3), by $$V_{BL18} = \gamma\left(\Lambda H_{P\perp} + \frac{\pi\Delta_0 Q^{1/2}}{2\alpha} H_{\parallel}\right) \quad (4)$$

The velocity $V_{BL19}$ of the Bloch line 19 is given by $$V_{BL19} = \gamma\left(\Lambda H_{P\perp} - \frac{\pi\Delta_0 Q^{1/2}}{2\alpha} H_{\parallel}\right) \quad (5)$$

Since the magnitudes of ζ and $\Delta_0$ are substantially equal, the effect of the in-plane magnetic field H" is $\pi Q^{\frac{1}{2}}/2\alpha$ times as large as the effect of the perpendicular pulse magnetic field $H_{P\perp}$. When a magnetic film such as garnet which is usually used as a magnetic bubble material, $Q > 1$ and $\alpha \ll 1$. Accordingly, the in-plane magnetic field H" more affects to the velocity of the Bloch line than the perpendicular pulse magnetic field $H_{P\perp}$ does under the same magnitude of the magnetic field. Thus, the in-plane magnetic field H" provides a very large drive force.

Thus, even if the magnetic film which is usually used as the magnetic bubble material is used, it is possible to move only one Bloch line of the Bloch line pair 6 by the in-plane magnetic field H" which is a smaller than the perpendicular pulse magnetic field $H_{P\perp}$.

Similarly, when the in-plane magnetic field H" is applied in the opposite direction as shown by an arrow 13B in FIG. 3B, the force H" acts to shorten the spacing between the Bloch lines and only the right Bloch line 19 of the pair is moved to the left as shown in FIG. 4D.

The transfer of the Bloch line pair between the potential well in the magnetic wall to which the magnetic field distribution $H_X$ as shown in FIG. 4A is applied is explained.

As shown in FIG. 4B, when the in-plane magnetic field H" and the perpendicular pulse magnetic field $H_{P\perp}$ are applied by waveforms 20A and 21A to an area (potential well) at which the Bloch line pair 6 is stable, only the Bloch line 18 is moved to the left by the above effect to reach a next stable position (adjacent potential well). Accordingly, the Bloch line is moved as shown in FIG. 4C and stabilized at the position 181. By applying the in-plane magnetic field H" and the perpendicular pulse magnetic field $H_{P\perp}$ as shown by 20 B and 21B of FIG. 4D, only the Bloch line 19 is now moved to the left and stabilized at the position 191.

In the graphs of FIGS. 4C and 4D, the fall of the waveform of the in-plane magnetic field H" occurs at an earlier timing than the fall of the perpendicular pulse magnetic field $H_{P\perp}$ in order to prevent the drive force $F_{H''}$ by the in-plane magnetic field H" from acting on the Bloch line pair 6 when a restoring force $-F_{HP\perp}$ developed by the fall of the perpendicular pulse magnetic field $H_{P\perp}$ acts on the Bloch line pair 6. In order to stably transfer the Bloch line pair 6 in one direction, a restraint force to the Bloch line by a peak $H_{XP}$ of the magnetic field distribution $H_X$ of FIG. 3A is utilized and the transfer by only the perpendicular pulse magnetic field is prevented. Accordingly, from a standpoint of transfer speed, a relationship between the two different magnetic fields $H_{P\perp}$ $H_{XP}$ is given, from the formulas (2) and (3), by $$\Lambda\gamma H_{P\perp} < \frac{\pi\Delta_0\gamma Q^{1/2}}{2\alpha} H_{XP} \quad (6)$$

In order to transfer the Bloch line beyond the potential well of the magnetic field distribution $H_X$, $$\Lambda\gamma H_{P\perp} + \frac{\pi\Delta_0\gamma Q^{1/2}}{2\alpha} H_{\parallel} > \frac{\pi\Delta_0\gamma Q^{1/2}}{2\alpha} H_{XP} \quad (7)$$

must be met. Since it is necessary to prevent the Bloch line 19 from being moved to the right by the in-plane magnetic field H" in FIG. 4C, $$H_{PX} > H'' \quad (8)$$

From the formulas (6), (7) and (8), it is possible to stably move the Bloch line in the magnetic wall in one direction by applying the in-plane magnetic field H″ and the perpendicular pulse magnetic field $H_{P\perp}$ which meet $$\left. \begin{array}{l} H_{\parallel} < H_{XP} \\ \dfrac{2\alpha}{\pi Q} H_{P\perp} < H_{XP} \\ H_{\parallel} + \dfrac{2\alpha}{\pi Q} H_{P\perp} > H_{XP} \end{array} \right\} \quad (9)$$

In order to transfer the Bloch line by one bit, the distance of movement in the time $\Delta t$ in which the in-plane magnetic field H″ and the perpendicular pulse magnetic field $H_{P\perp}$ overlap each other should be smaller than a pitch $\Delta X_P$ of the magnetic field distribution $H_X$. Thus, from the formula (4), the two magnetic fields H″ and $H_{P\perp}$ are overlapped in a time $\Delta t$ which meets $$\gamma \left( \Delta H_{P\perp} + \frac{\pi \Delta_0 Q^{1/2}}{2\alpha} H_{\parallel} \right) \Delta t < \Delta X_P \quad (10)$$

so that stable bit-by-bit transfer is attained. In the above principle, it is assumed that the magnetic wall does not move. When the magnetic wall moves, the Bloch line may be transferred in the substantially same theory.

A specific transfer apparatus is explained with reference to FIG. 5. Numeral 24 denotes a chip of the magnetic film including the stripe magnetic domain having the magnetic wall including the Bloch lines, numeral 25 denotes a coil for applying a magnetic field along a longitudinal direction of the stripe magnetic domain (laterally on the plane of drawing), numeral 26 denotes a coil for applying a magnetic field perpendicularly to the magnetic film (vertically to the plane of drawing), numeral 27 denotes a pulse driver for applying a pulse current to the coil 25, numeral 28 denotes a pulse driver for applying a pulse current to the coil 26, and numeral 29 denotes a timing controller including a trigger pulse generator for controlling the timing of the pulse drivers 27 and 28. The stable Bloch line pair transfer is attained by such a simple magnetic field application system. The trigger pulse generator 29 drives the pulse drivers 27 and 28 at the timing which meets the formula (10). The pulse drivers 27 and 28 supply pulse currents having the waveforms 20A and 20B of the in-plane magnetic field H″ and 21A and 21B of the perpendicular pulse magnetic field $H_{P\perp}$ of FIGS. 4C and 4D to the coils 25 and 26, respectively.

$(YSmLuGa)_3(GeFe)_5O_{12}$ is used as the magnetic film of the chip 24. It has a magnetic parameter $4\pi M = 195$ (gausses), a stiffness constant $A = 2.63 \times 10^{-7}$ (crg/cm), an anisotropy constant $Ku = 8690$ (erg/cm$^3$), $\alpha = 0.11$ and $\gamma = 1.83 \times 10^7$.

Figure 7:
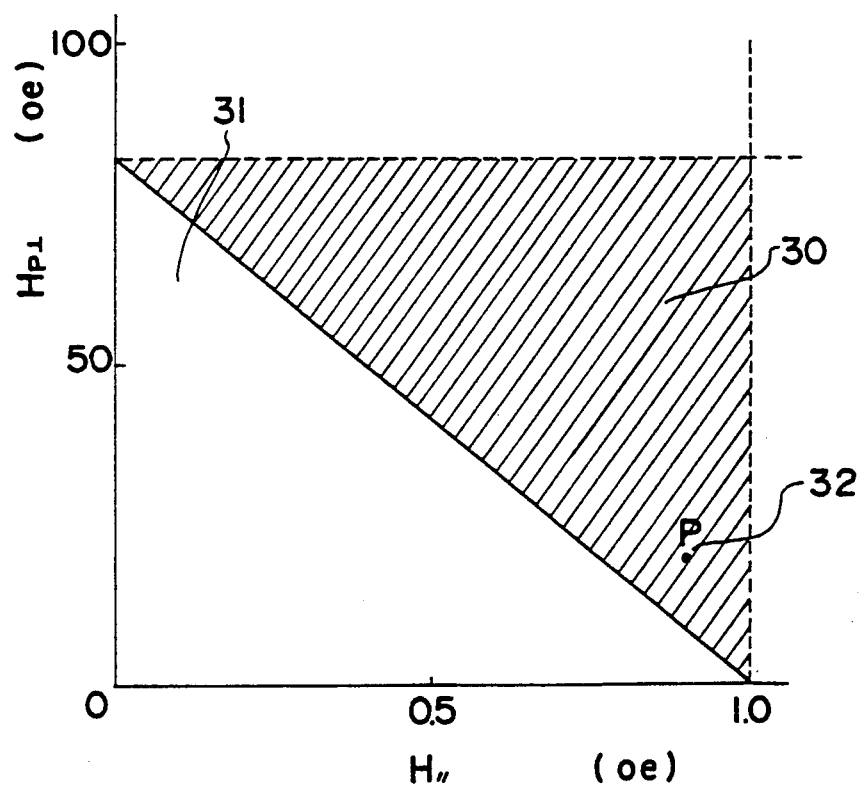
FIG. 7 shows a graph of a range of an amplitude of an in-plane magnetic field pulse and an amplitude of a perpendicular pulse magnetic field, which allows transfer of the Bloch lines in accordance with the transfer method of the present invention, and FIG. shows a block diagram of one embodiment of a magnetic memory apparatus of the present invention.

When an amplitude of the potential well $H_X$ is 10e and the pitch $\Delta X_P$ of the period of the potential well is 1 μm, a transferable range of the in-plane pulse magnetic field amplitude H″ and the perpendicular pulse magnetic field amplitude $H_{P\perp}$ is given by a hatched area 30 in FIG. 7 from the condition of the formula (10). In FIG. 7, a blank area 31 is a non-transferable area and an area other than the hatched area 30 and the blank area 31 permits transfer but not bit-by-bit transfer. Assuming that the in-plane magnetic field H″=0.9 Oe and the perpendicular pulse magnetic field $H_{P\perp}$ is 20 Oe, the overlap time $\Delta t$ of the in-plane magnetic field pulse and the perpendicular magnetic field pulse should be less than 20 nsec from the condition of the formula (10). This can be readily controlled by the trigger pulse generator of the timing controller 29.

Figure 6:
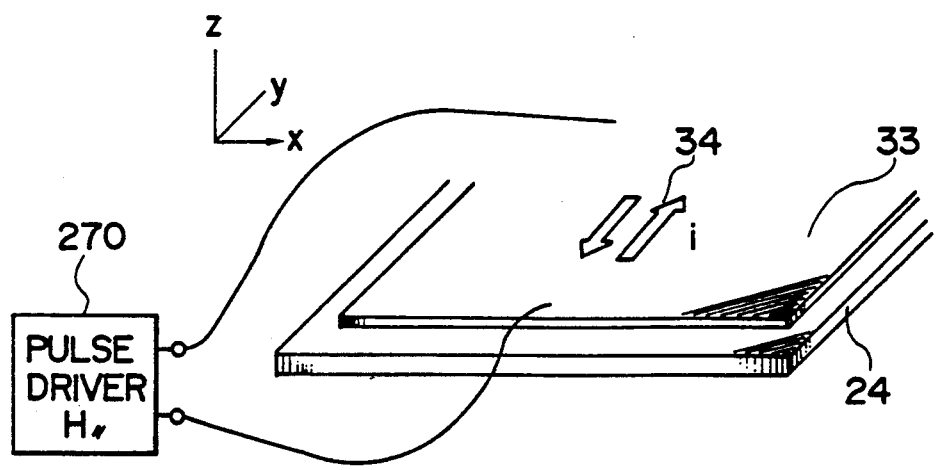
FIG. 6 shows another apparatus for implementing the transfer method of the present invention.

FIG. 6 shows a modification of the transfer apparatus. Numeral 24 denotes a chip having the magnetic film, numeral 270 denotes a pulse driver for applying the in-plane magnetic field H″, numeral 33 denoted a conductor layer formed on the chip 24 for applying the in-plane magnetic field H″, and numeral denotes a direction of a current i which flows through the conductor layer 33.

Figure 5:
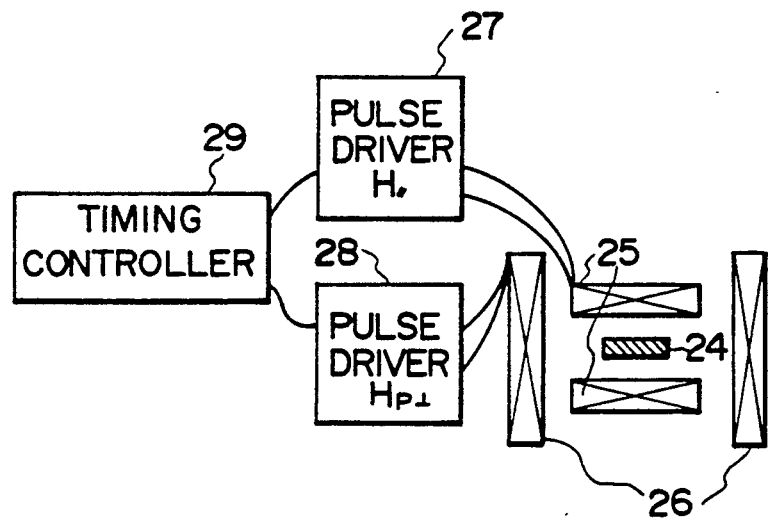
FIG. 5 shows an apparatus for implementing the transfer method shown in FIGS. 3A and 3B and FIGS. 4A-4D.

In the present embodiment, instead of the coil 25 for applying the in-plane magnetic field H″ used in the embodiment of FIG. 5, the current i is supplied in the direction 31 to the conductor layer 33 formed on the chip 24 to apply the in-plane magnetic field H″ to the stripe magnetic domain. The longitudinal direction of the stripe magnetic domain is in the X direction. In the present embodiment, since the spacing between the conductor layer 33 and the magnetic film 24 is small, the current i necessary to generate H″ which meets the condition (9) may be small and the Bloch line can be transferred with a low power consumption.

Figure 8:
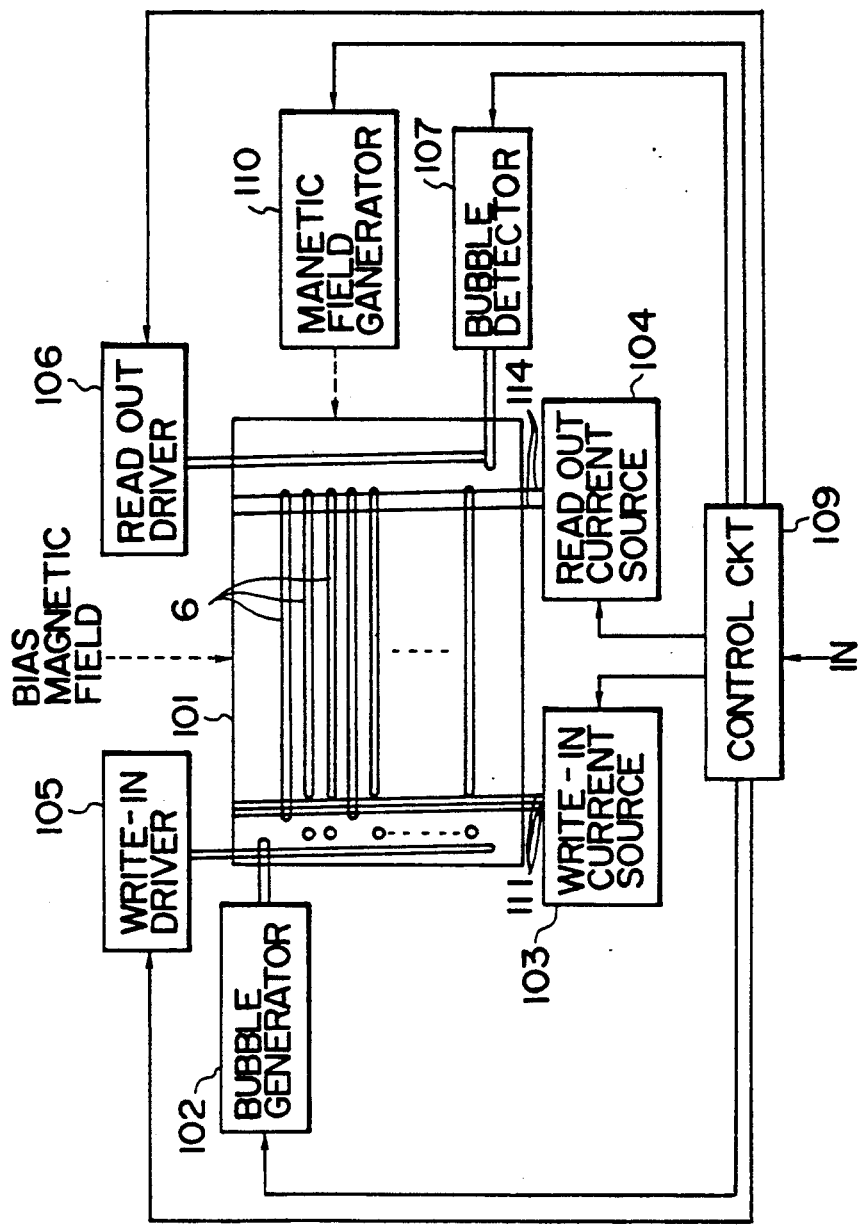

FIG. 8 shows a block diagram of one embodiment of the magnetic memory apparatus which transfers the Bloch lines which are information carrier by utilizing the transfer method of the present invention.

In FIG. 8, numeral 101 denotes a Bloch line memory substrate on which a plurality of stripe magnetic domains 6 are arranged at a constant pitch orthogonally to a longitudinal direction of the stripe magnetic domain 6. Potential wells are formed at a constant pitch in magnetic walls of the stripe magnetic domains 6 along the magnetic walls. Information is time-serially stored by distribution of Bloch lines in the potential well train. Numeral 102 denotes a magnetic bubble generator which time-serially generates magnetic bubbles in accordance with input information. The magnetic bubbles representing the input information are transferred to the corresponding stripe magnetic domain 6 by a write driver 105.

Numeral 106 denotes a read driver which converts the Bloch lines to the magnetic bubbles in a method shown in U.S. Pat. No. 4,583,200 in order to reproduce the information, and transfers the magnetic bubbles at the tip ends of the stripe magnetic domains 6 to a bubble detector 107.

The bubble detector 107 time-serially detects the magnetic bubbles transferred by the read driver 106 by utilizing a magneto-resistive effect to convert then to an electrical signal representing the information.

Numeral 103 denotes a write current source for supplying a current to a write conductor 111 when information is to be written in the Bloch line, numeral 104 denotes a read current source for supplying a current to a read conductor 114 when information is to be read from the Bloch line, numeral 110 denotes a magnetic field generator for generating the perpendicular pulse magnetic field and the in-plane pulse magnetic field to the substrate 101, which may be the magnetic field generation system shown in FIG. 5, and numeral 109 denotes a control circuit which controls the drivers 105 and 106, generators 102 and 110, detector 107 and sources 103 and 104 in accordance with an input signal (IN).

In the magnetic memory apparatus shown in FIG. 8, a method for forming the Bloch lines in the magnetic walls of the stripe magnetic domains 6 to record information and a method for detecting the presence or absence of the Bloch line in order to reproduce information are described in detail in U.S. Pat. No. 4,583,200. Accordingly, the recording and reproduction of information are not described herein.

The magnetic field generator 110 generates the pulse magnetic field perpendicular to the film plane of the magnetic thin film having the stripe magnetic domains 6 formed therein, and the in-plane pulse magnetic field parallel to the longitudinal direction of the stripe magnetic domains 6. A signal is applied to the magnetic field generator 110 from the control circuit 109 through the timing controller 29 shown in FIG. 5. Specifically, a control signal is sent from the control circuit 109 to the timing controller, which applies the perpendicular pulse magnetic field and the in-plane pulse magnetic field to the magnetic walls of the stripe magnetic domains 6 of the substrate 100 at a predetermined timing and a predetermined magnetic field strength, in accordance with the control signal.

By the use of the magnetic field generator 110, the first and second Bloch lines of the Bloch line pair present in the potential well in the magnetic wall of the stripe magnetic domain 6 are serially transferred to potential wells which are adjacent to each other by the action of the two magnetic fields.

The potential well is formed to surround the stripe magnetic domain 6 along the magnetic wall thereof, and the stable points of the Bloch lines by the potential well are formed at substantially constant pitch except for the opposite ends of the stripe magnetic domain 6, that is, vicinities of the Bloch line write position and read position.

The transfer of the Bloch line pair by the magnetic field generator 110, the writing of the Bloch line by the write conductor 111 and the detection of the Bloch line by the read conductor 114 are synchronously controlled by the control circuit 109 through the write current source 103 and the read current source 104.

Accordingly, by accurately and stably transferring the Bloch line pair by the magnetic field generator 110, the recording of information to the magnetic wall of the stripe magnetic domain 6 and the reproduction of the information from the stripe magnetic domain 6 are accurately and rapidly effected.

The above magnetic memory apparatus converts the Bloch lines to the magnetic bubbles to read the information, or converts the information to the presence or absence of bubble to write the information into the Bloch line. However, such information recording and reproduction, that is, reading and writing of information from or to the Bloch line may be done by other means, for example, by optical means proposed in U.S. Pat. No. 5,111,235 assigned to the assignee of the present invention.

In accordance with the transfer method of the Bloch lines of the present invention, the Bloch lines of the Bloch line pair are separated and driven (moved) separately. Accordingly, the stabilization of the Bloch lines by the potential well is readily attained and the vibration due to the repelling force of the Bloch lines need not be considered. In order to transfer the Bloch lines in one direction, the perpendicular pulse magnetic field and the in-plane magnetic field may be of conventional symmetric square pulse waveform. As a result, a peripheral circuit may be simplified. In order to move the Bloch line pair to the next bit position, the difference between the timings of the two pulse magnetic fields rather than the widths of the pulse magnetic fields is utilized. As a result, the control is easy to attain.

The fall time need not be long to attain the unidirectional transfer, and hence the high speed transfer is attained. By setting the parallel magnetic field H" larger than the perpendicular magnetic field $H_{P\perp}$, the transfer is attained with smaller current and the power consumption is reduced.

We claim:

1. A method for transferring a Bloch line pair present in a magnetic wall of a magnetic domain formed in a magnetic thin film, in a predetermined direction along said magnetic wall, comprising the steps of:

first applying a pulse magnetic field parallel to a film plane of the magnetic thin film to the magnetic thin film in a first direction along the magnetic wall and, applying a pulse magnetic field perpendicular to the film plane of the magnetic thin film to the magnetic thin film; and second, after said first applying step, applying a pulse magnetic field parallel to the film plane of the magnetic thin film to the magnetic thin film in a second direction opposite to the first direction and, applying a pulse magnetic field perpendicular to the film plane of the magnetic thin film to the magnetic thin film, wherein the Bloch line pair is transferred in the predetermined direction by said first and second applying steps.

2. A method according to claim 1, wherein said magnetic field perpendicular to said film plane and that parallel to said film plane are simultaneously applied during a time period of $\Delta t$ in each of said first and second steps.

3. A method for transferring Bloch lines according to claim 2, wherein $$H_\| < H_{XP}$$

$$\frac{2\alpha}{\pi Q} H_{P\perp} < H_{XP}$$

$$H_\| + \frac{2\alpha}{\pi Q} H_{P\perp} > H_{XP}$$

where H" is a magnitude of the in-plane magnetic field, $H_{P\perp}$ is a magnitude of the perpendicular magnetic field, $H_{XP}$ is a magnitude of a peak of a magnetic field distribution formed in said magnetic wall to form a stable point of the Bloch line, $\alpha$ is a Gilbert damping constant, $Q = Kv/2\pi Ms^2$, Kv is a uniaxial anisotropy constant and Ms is a saturation magnetization.

4. A method for transferring Bloch lines according to claim 3, wherein $$\gamma \left( \Lambda H_{P\perp} + \frac{\pi \Delta_0^{1/2}}{2\alpha} H_\| \right) \Delta t < \Delta X_P$$

where $\gamma$ is a gyro-force magnetic constant, $\Lambda$ is a Bloch line width parameter, $\Delta_0$ is a magnetic wall parameter, and $\Delta X_P$ is a pitch of the magnetic field distribution.

5. An apparatus for transferring a Bloch line pair present in a magnetic wall of a magnetic domain formed in a magnetic thin film, in a predetermined direction along said magnetic wall, comprising:

first magnetic field generation means for applying a pulse magnetic field parallel to a film plane of the magnetic thin film, to the magnetic thin film along the magnetic wall;

second magnetic field generation means for applying a pulse magnetic field perpendicular to magnetic wall and, applying a pulse magnetic field perpendicular to the film plane of the magnetic thin film to the magnetic thin film; and second, after said first applying step, applying a pulse magnetic field parallel to the film plane of the magnetic thin film to the magnetic thin film in a second direction opposite to the first direction and, applying a pulse magnetic field perpendicular to the film plane of the magnetic thin film to the magnetic thin film, wherein the Bloch line pair is transferred in the predetermined direction by said first and second applying steps.

6. An apparatus according to claim 5, wherein said first and second magnetic field generating means apply a pulse magnetic field to the whole of a substrate for holding said magnetic thin film relative to the substrate.

7. An apparatus according to claim 5, wherein the first and third pulse magnetic fields, and the second and fourth pulse magnetic fields, are simultaneously applied during a time period of $\Delta t$.

8. An apparatus according to claim 7, wherein $$H_\| < H_{XP}$$

$$\frac{2\alpha}{\pi Q} H_{P\perp} < H_{XP}$$

$$H_\| + \frac{2\alpha}{\pi Q} H_{P\perp} > H_{XP}$$

where $H''$ is a magnitude of the in-plane magnetic field, $H_{P\perp}$ is a magnitude of the perpendicular magnetic field, $H_{XP}$ is a magnitude of a peak of a magnetic field distribution formed in the magnetic wall to form a stable point of the Bloch line, $\alpha$ is a Gilbert damping constant, and $Q = Kv/2\pi Ms^2$ where $Kv$ is a uniaxial anisotropy constant and $Ms$ is a saturation magnetization.

9. An apparatus according to claim 8, wherein $$\gamma \left( \Lambda H_{P\perp} + \frac{\pi \Delta_0^{1/2}}{2\alpha} H_\| \right) \Delta t < \Delta X_P$$

where $\gamma$ is a tyro-force magnetic constant, $\Lambda$ is a Bloch line width parameter, $\Delta_O$ is a magnetic wall parameter, and $\Delta X_P$ is a pitch of the magnetic filed distribution.

10. A method for transferring a Bloch line present in a magnetic wall of a magnetic domain formed in a magnetic thin film, in a predetermined direction along said magnetic wall, comprising the steps of:

first applying a pulse magnetic field parallel to the film plane of said magnetic thin film in a direction along said magnetic wall to said magnetic thin film; and second, applying a pulse magnetic field perpendicular to the film plane of said magnetic thin film to said magnetic thin film substantially at the same time as said first applying step is performed, wherein application of the pulse magnetic field in said first applying step is initiated earlier than is application of the pulse magnetic field in said second applying step and the pulse magnetic field in said first applying step is removed earlier than is the pulse magnetic field of said second applying step, both of the pulse magnetic fields being simultaneously applied during a predetermined time period.

11. A method for transferring a Bloch line present in a magnetic wall of a magnetic domain formed in a magnetic thin film in a predetermined direction along said magnetic wall, comprising the steps of:

first applying a first pulse magnetic field parallel to a film plane of the magnetic thin film to the magnetic thin film in a direction along said magnetic wall; and second applying a second pulse magnetic field perpendicular to the film plane of the magnetic thin film substantially at the same time as the first applying step is performed.

wherein said first and second applying steps are so performed as to transfer one of the Bloch line pair present in said magnetic wall and wherein application of the first pulse magnetic field is initiated earlier than is the application of the second pulse magnetic field, both of the pulse magnetic fields are simultaneously applied during a predetermined time period, and the first pulse magnetic field is removed earlier than is the second pulse magnetic field.

12. A method according to claim 11, wherein the first and second pulse magnetic fields comprise pulses of a substantially symmetrical waveform.

13. An apparatus for transferring a Bloch line pair present in a magnetic wall of a magnetic domain formed in a magnetic thin film in a direction along said magnetic wall, comprising:

a first magnetic field generator for applying a first pulse magnetic field parallel to a film plane of the magnetic thin film to the magnetic thin film in a direction along said magnetic wall;

a second magnetic field generator for applying a second pulse magnetic field perpendicular to the film plane of the magnetic thin film; and control means for controlling said first and second magnetic field generators so as to apply the first and second pulse magnetic fields to the magnetic thin film substantially at the same time, wherein said control means controls said first and second magnetic field generators so as to sequentially transfer each Bloch line of the bloch line pair present in said magnetic wall and wherein said control means so controls said first and second magnetic field generators that application of the first pulse magnetic field is initiated earlier than is the second pulse magnetic field, the first and second pulse magnetic fields are simultaneously applied during a predetermined time period, and the first pulse magnetic field is removed earlier than is the second pulse magnetic field.

14. An apparatus according to claim 13, wherein the first and second pulse magnetic fields comprise pulses of a substantially symmetrical waveform.

15. An apparatus according to claim 13, wherein said control means controls said first magnetic field generator so as to alternately apply the first pulse magnetic field in a first direction along said magnetic wall and in a second direction opposite to the first direction to the magnetic thin film.

16. An information recording/reproducing apparatus for recording information on a substrate formed of a magnetic thin film having a stripe magnetic domain and reproducing the information recorded on the substrate, comprising:
- input means responsive to information to be recorded for inputting a Bloch line in said magnetic wall of said magnetic domain;
- means for detecting said Bloch line present in said magnetic wall and reproducing the information; and
- transfer means for transferring said Bloch line in a direction along said magnetic wall by applying a second pulse magnetic field perpendicular to a film plane of the magnetic thin film substantially at the same time as said transfer means applies a first pulse magnetic field parallel to the film plane of the magnetic thin film in a direction along said magnetic wall,
- wherein said transfer means sequentially transfers each bloch line of a Bloch line pair present in said magnetic wall and applies the first and second magnetic fields in such a manner that application of the first pulse magnetic field is initiated earlier than the second pulse magnetic field, the first and second pulse magnetic fields are simultaneously applied during a predetermined time period, and the first pulse magnetic field is removed earlier than the second pulse magnetic field.

17. An apparatus according to claim 16, wherein the first and second pulse magnetic fields comprise pulses of a substantially symmetrical waveform.

18. A method for transferring a Bloch line pair present in a magnetic wall of a magnetic domain formed in a magnetic thin film, in a direction along said magnetic wall, comprising the steps of:
- first applying a pulse magnetic field parallel to a film plane of the magnetic thin film to the magnetic thin film in a first direction along said magnetic wall substantially at the same time as a pulse magnetic field perpendicular to the film plane of the magnetic thin film is applied to the magnetic thin film; and
- second, after the first applying step, applying a pulse magnetic field parallel to the film plane of the magnetic thin film in a second direction opposite the first direction at the same time as a pulse magnetic field perpendicular to the film plane of the magnetic thin film is applied to the magnetic thin film, wherein in said first and second steps, application of a pulse magnetic field parallel to the film plane is initiated earlier than is the application of a pulse magnetic field perpendicular to the film plane, both of the magnetic pulse fields are simultaneously applied during a predetermined time period, and the pulse magnetic field parallel to the film plane is removed earlier than is the pulse magnetic field perpendicular to the film plane.

19. A method according to claim 18, wherein the first and second pulse magnetic fields comprise pulses of a substantially symmetrical waveform.

20. An apparatus for transferring a Bloch line pair present in a magnetic wall of a magnetic domain formed in a magnetic thin film in a direction along said magnetic wall, comprising:
- a first magnetic field generator for applying a pulse magnetic field parallel to a film plane of the magnetic thin film;
- a second magnetic field generator for applying a pulse magnetic field perpendicular to the film plane of the magnetic thin film; and
- control means for controlling the first and second magnetic field generators in such a manner that said means applies a pulse magnetic field perpendicular to the film plane of the magnetic thin film to the magnetic thin film substantially at the same time as a pulse magnetic field parallel to the film plane of the magnetic thin film is applied to the magnetic thin film in a first direction along said magnetic wall, and then a pulse magnetic field perpendicular to the film plane is applied to the magnetic thin film substantially at the same time as a pulse magnetic field parallel to the film plane is applied to the magnetic thin film in a second direction opposite to the first direction, wherein application of a pulse magnetic field parallel to the film plane is initiated earlier than is application of a pulse magnetic field perpendicular to the film plane, both of the pulse magnetic fields are simultaneously applied during a predetermined time period, and the pulse magnetic field parallel to the film plane is removed earlier than is the pulse magnetic field perpendicular to the film plane.

21. An information recording/reproducing apparatus for recording information on a substrate formed of a magnetic thin film including a stripe magnetic domain and reproducing the information recorded on the substrate, comprising:
- input means responsive to information to be recorded for inputting a Bloch line pair in a magnetic wall of said magnetic domain;
- means for detecting the Bloch line pair present in said magnetic wall and reproducing information; and
- transfer means for transferring one of a Bloch line pair in a predetermined direction by applying a pulse magnetic field parallel to a film plane of the magnetic thin film to the magnetic thin film in a first direction along said magnetic wall substantially at the same time as a pulse magnetic field perpendicular to the film plane of the magnetic thin film is applied to the magnetic thin film and then transferring the other of the Bloch line pair in the predetermined direction by applying a pulse magnetic field parallel to the film plane to the magnetic thin film in a second direction opposite to the first direction substantially at the same time as a pulse magnetic field perpendicular to the film plane of the magnetic thin film is applied to the magnetic thin film, wherein application of the pulse magnetic field parallel to the film plane is initiated earlier than is application of the pulse magnetic field perpendicular to the film plane, both of the pulse magnetic fields are simultaneously applied during a predetermined time period, and the pulse magnetic field parallel to the film plane is removed earlier than is the pulse magnetic field perpendicular to the film plane.

22. An apparatus according to claim 21, wherein the first and second pulse magnetic fields comprise pulses of a substantially symmetrical waveform.

23. A method for transferring a first and a second Bloch line present at a first position in a magnetic wall of a magnetic domain formed in a magnetic thin film in a predetermined direction from the first position to a second position by use of a perpendicular pulse magnetic field perpendicular to a film plane of the magnetic thin film and an in-plane pulse magnetic field parallel to the film plane of the magnetic thin film, said method comprising the steps of:

transferring the first Bloch line in the predetermined direction to the second position by applying the perpendicular pulse magnetic field to the film plane of the magnetic thin film at substantially the same time as the in-plane pulse magnetic field, such that the second Bloch line is not moved in the predetermined direction to the second position; and second, after transferring the first Bloch line, transferring the second Bloch line in the predetermined direction to the second position by applying the perpendicular pulse magnetic field to the film plane of the magnetic thin film at substantially the same time as the in-plane pulse magnetic field, such that the transferred first Bloch line is not moved in a direction opposite to the predetermined direction.

24. A method according to claim 23, wherein when transferring the first Bloch line, the in-plane pulse magnetic field is applied to the magnetic thin film in a first direction along the magnetic wall, and when transferring the second Bloch line, the in-plane pulse magnetic field is applied to the magnetic thin film in a second direction along the magnetic wall opposite the first direction, and wherein, when transferring the first and second Bloch lines, application of the in-plane pulse magnetic field is initiated earlier than application of the perpendicular pulse magnetic field, and the in-plane pulse magnetic field is removed earlier than the perpendicular pulse magnetic field.

25. A method according to claim 24, wherein the in-plane pulse magnetic field and the perpendicular pulse magnetic comprise pulses of a substantially symmetrical waveform.

26. An apparatus for transferring a first and a second Bloch line present at a first position in a magnetic wall of a magnetic domain formed in a magnetic thin film in a predetermined direction from the first position to a second position, said apparatus comprising:

magnetic field supply means for applying to the magnetic thin film an in-plane pulse magnetic field parallel to a film plane of the magnetic thin film and a perpendicular pulse magnetic field perpendicular to the film plane of the magnetic thin film; and control means for controlling said magnetic field supply means to apply the perpendicular pulse magnetic field and the in-plane pulse magnetic field to the magnetic thin film substantially at the same time to transfer the first Bloch line in the predetermined direction from the first position to the second position, such that the second Bloch line is not moved in the predetermined direction, and then, applying the perpendicular pulse magnetic field and the in-plane pulse magnetic field to the magnetic thin film substantially at the same time to transfer the second Bloch line in the predetermined direction from the first position to the second position, such that the transferred first Bloch line is not moved in a direction opposite to the predetermined direction.

27. An apparatus according to claim 26, wherein said control means controls said magnetic field supply means so as to apply the in-plane pulse magnetic field to the magnetic thin film in a first direction along said magnetic wall during transfer of the first Bloch line, and controls said magnetic field supply means so as to apply the in-plane pulse magnetic field to the magnetic thin film in a second direction along said magnetic wall opposite to the first direction during transfer of the second Bloch line, and wherein said control means, during transfer of the first and second Bloch lines, controls said magnetic field supply means such that application of the in-plane pulse magnetic field is initiated earlier than the perpendicular pulse magnetic field, and the in-plane pulse magnetic field is removed earlier than the perpendicular pulse magnetic field.

28. An apparatus according to claim 26, wherein the in-plane pulse magnetic field and the perpendicular pulse magnetic field applied by said magnetic field supply means comprise pulses of a substantially symmetrical waveform.

29. An information recording/reproducing apparatus for recording/reproducing information by utilizing a Bloch line pair comprising first and second Bloch lines present in a magnetic wall of a magnetic domain formed in a magnetic thin film, said apparatus comprising:

input means responsive to information to be recorded, for inputting the Bloch lien pair in said magnetic wall;

means for detecting the Bloch line pair in said magnetic wall and reproducing the information;

magnetic field supply means for applying to the magnetic thin film an in-plane pulse magnetic field parallel to a film plane of the magnetic thin film and a perpendicular pulse magnetic field perpendicular to the film plane of the magnetic thin film; and control means for controlling said magnetic field supply means to apply the perpendicular pulse magnetic field and the in-plane pulse magnetic field to the magnetic thin film at the same time to transfer the first Bloch line in a predetermined direction to a predetermined position such that the second Bloch line is not moved in the predetermined direction, and then, applying the perpendicular pulse magnetic field and the in-plane pulse magnetic field to the magnetic thin film substantially at the same time to transfer the second Bloch line in the predetermined direction to the predetermined position such that the transferred first Bloch line is not moved in a direction opposite to the predetermined direction.

30. An apparatus according to claim 29, wherein said control means upon transfer of the first Bloch line controls said magnetic field supply means so as to apply the in-plane pulse magnetic field to the magnetic thin film in a first direction along said magnetic wall, and upon transfer of the second Bloch line controls said magnetic field supply means so as to apply the in-plane pulse magnetic field to the magnetic thin film in a second direction opposite to the first direction, and wherein said control means upon the transfer of the first and second Bloch lines controls said magnetic field supply means such that application of the in-plane pulse magnetic field is initiated earlier than the perpendicular pulse magnetic field, and the in-plane pulse magnetic field is removed earlier than the perpendicular pulse magnetic field.

31. An apparatus according to claim 29, wherein the in-plane pulse magnetic field and the perpendicular pulse magnetic field applied by said magnetic field supply means comprise pulses of a substantially symmetrical waveform.

* * * * *

UNITED STATES PATENT AND TRADEMARK OFFICE
CERTIFICATE OF CORRECTION

PATENT NO. : 5,179,532

DATED : January 12, 1993

INVENTOR(S) : TAKEO ONO, ET AL.

It is certified that error appears in the above-identified patent and that said Letters Patent is hereby corrected as shown below:

On title page,

IN [54] TITLE

"TRANSFERING" should read --TRANSFERRING--.

IN [57] ABSTRACT

Line 10, "film," should read --thin film,--.

SHEET 7 OF 7

FIG. 8, "MANETIC" should read --MAGNETIC-- and "CKT" should read --CIR--.

COLUMN 1

Line 1, "TRANSFERING" should read --TRANSFERRING--.
    Line 30, "and," should read --and--.
    Line 31, "opto magnetic" should read --opto-magnetic--.
    Line 41, "easy axis of" should read --axis of--.
    Line 44, "diameter)" should read --diameter),--.
    Line 48, "future," should read --the future,--.
    Line 55, "are" should read --is--.

COLUMN 2

Line 28, "any" should read --easy--.

UNITED STATES PATENT AND TRADEMARK OFFICE
CERTIFICATE OF CORRECTION

PATENT NO. : 5,179,532

DATED : January 12, 1993

INVENTOR(S) : TAKEO ONO, ET AL.

It is certified that error appears in the above-identified patent and that said Letters Patent is hereby corrected as shown below:

COLUMN 3

Line 40, "for" should read --of--.
Line 63, "for" should read --from--.

COLUMN 4

Line 20, "FIG." should read --FIG. 8--.
Line 61, "denotes" should read --denote--.

COLUMN 5

Line 65, "$\zeta$" should read --$\Lambda$--.

COLUMN 6

Line 11, "a" should be deleted.
Line 50, "$H_{P\perp}H_{XP}$" should read --$H_{P\perp}$ and $H_{XP}$--.
Line 67, "$H_{PX}>H$"" should read --$H_{XP}>H_{\parallel}$--.

COLUMN 8

Line 8, "denoted" should read --denotes--.
Line 10, "numeral" should read --numeral 34--.
Line 27, "carrier" should read --carriers--.

COLUMN 10

Line 47, "$H$"" should read --$H_{\parallel}$--.

UNITED STATES PATENT AND TRADEMARK OFFICE
CERTIFICATE OF CORRECTION

PATENT NO. : 5,179,532

DATED : January 12, 1993

INVENTOR(S) : TAKEO ONO, ET AL.

It is certified that error appears in the above-identified patent and that said Letters Patent is hereby corrected as shown below:

COLUMN 11

Line 6, "perpendicular to magnetic" should read --perpendicular to the film plane of the magnetic thin film, to the magnetic thin film; and control means for synchronously controlling said first and second magnetic field generation means, wherein said control means generates first and second pulse magnetic fields, in order, from said second magnetic field generation means, and generates third and fourth pulse magnetic fields, having opposite directions to each other, in order, from said first magnetic field generation means, and the Bloch line pair is transferred in the predetermined direction by applying the first and third pulse magnetic fields to the magnetic thin film substantially at the same time and also applying the second and fourth pulse magnetic fields to the magnetic thin film substantially at the same time.--.

Lines 7-18 should be deleted.
Line 36, "H"" should read --$H_\parallel$--.
Line 49, "tyro-" should read --gyro- --.
Line 51, "filed" should read --field--.

COLUMN 12

Line 15, "performed." should read --performed,--.
Line 47, "bloch" should read --Bloch--.

COLUMN 13

Line 18, "bloch" should read --Bloch--.

UNITED STATES PATENT AND TRADEMARK OFFICE
CERTIFICATE OF CORRECTION

PATENT NO. : 5,179,532
DATED : January 12, 1993
INVENTOR(S) : TAKEO ONO, ET AL.

It is certified that error appears in the above-identified patent and that said Letters Patent is hereby corrected as shown below:

COLUMN 15

Line 31, "magnetic" should read --magnetic field--.

COLUMN 16

Line 20, "lien" should read --line--.

Signed and Sealed this

Twenty-second Day of March, 1994

Attest:

BRUCE LEHMAN

*Attesting Officer*   *Commissioner of Patents and Trademarks*